US010182517B2

(12) United States Patent
Yoshikawa et al.

(10) Patent No.: US 10,182,517 B2
(45) Date of Patent: Jan. 15, 2019

(54) ELECTRONIC APPARATUS ENCLOSURE DEVICE AND ELECTRONIC APPARATUS COOLING SYSTEM

(71) Applicant: NEC Corporation, Tokyo (JP)

(72) Inventors: Minoru Yoshikawa, Tokyo (JP); Kenichi Inaba, Tokyo (JP); Masanori Sato, Tokyo (JP); Akira Shoujiguchi, Tokyo (JP); Arihiro Matsunaga, Tokyo (JP); Masaki Chiba, Tokyo (JP)

(73) Assignee: NEC Corporation, Tokyo (JP)

( * ) Notice: Subject to any disclaimer, the term of this patent is extended or adjusted under 35 U.S.C. 154(b) by 134 days.

(21) Appl. No.: 15/037,859

(22) PCT Filed: Nov. 14, 2014

(86) PCT No.: PCT/JP2014/005742
§ 371 (c)(1),
(2) Date: May 19, 2016

(87) PCT Pub. No.: WO2015/075916
PCT Pub. Date: May 28, 2015

(65) Prior Publication Data
US 2016/0295749 A1 Oct. 6, 2016

(30) Foreign Application Priority Data
Nov. 20, 2013 (JP) .................. 2013-239975

(51) Int. Cl.
F28F 7/00 (2006.01)
F28D 15/00 (2006.01)
(Continued)

(52) U.S. Cl.
CPC ..... H05K 7/20818 (2013.01); F28D 15/0266 (2013.01); F28D 15/0275 (2013.01); G06F 1/20 (2013.01); F28F 2250/06 (2013.01)

(58) Field of Classification Search
CPC ............ H05K 7/20818; F28D 15/0266; F28D 15/0275; F28D 15/06; G06F 1/20; F28F 2250/06
(Continued)

(56) References Cited

U.S. PATENT DOCUMENTS 5,159,972 A * 11/1992 Gunnerson ........... F24F 12/002
165/104.21
6,220,341 B1 4/2001 Izumi et al.
(Continued)

FOREIGN PATENT DOCUMENTS

JP 2011-165707 8/2011
JP 2011-171499 9/2011
(Continued)

OTHER PUBLICATIONS

Extended International Search Report dated Jun. 20, 2017 in corresponding PCT International Application Application No. 14863202.9, PCT/JP2014005742.
(Continued)

Primary Examiner — Jason Thompson
(74) Attorney, Agent, or Firm — Finnegan, Henderson, Farabow, Garrett & Dunner, L.L.P.

(57) ABSTRACT

A vapor pipe 103 connects a heat dissipation portion 200 and each of a plurality of heat receiving portions 102. A liquid pipe 104 connects the heat dissipation portion 200 and each of a plurality of the heat receiving portions 102. A bypass pipe 105 connects the vapor pipe 103 and the liquid pipe 104. A valve 106 opens and closes a flow path of the bypass pipe 105. A first connection portion 107 connects the vapor pipe 103 and the bypass pipe 105. A second connection portion 108 connects the liquid pipe 103 and the bypass pipe 105. The first connection portion 107 is disposed at a position higher than that of the second connection portion
(Continued)

108. As a result, refrigerant can be efficiently transported in a short time.

7 Claims, 12 Drawing Sheets

(51) Int. Cl.
*H05K 7/20* (2006.01)
*G06F 1/20* (2006.01)
*F28D 15/02* (2006.01)

(58) Field of Classification Search
USPC .................................. 165/80.2, 80.4, 104.21
See application file for complete search history.

(56) References Cited

U.S. PATENT DOCUMENTS

| | | | | |
|---|---|---|---|---|
| 7,315,448 B1 * | 1/2008 | Bash | ..................... | H05K 7/2079 165/80.3 |
| 2003/0136555 A1 * | 7/2003 | Dinh | ................... | F28D 15/0266 165/274 |
| 2007/0163754 A1 * | 7/2007 | Dionne | ............... | F28D 15/0266 165/104.21 |
| 2007/0209782 A1 * | 9/2007 | Wyatt | ................. | F28D 15/0266 165/76 |
| 2009/0284926 A1 * | 11/2009 | Agostini | ............. | F28D 15/0266 361/700 |
| 2009/0320500 A1 * | 12/2009 | Kim | ......................... | F25B 9/04 62/5 |
| 2011/0051372 A1 | 3/2011 | Barringer et al. | | |
| 2011/0127027 A1 | 6/2011 | Kashirajima et al. | | |
| 2013/0019627 A1 | 1/2013 | Yoshikawa et al. | | |
| 2013/0105117 A1 * | 5/2013 | Chludzinski | ............ | F28D 15/00 165/81 |
| 2013/0105120 A1 * | 5/2013 | Campbell | ............... | H05K 7/203 165/104.21 |

FOREIGN PATENT DOCUMENTS

| | | |
|---|---|---|
| JP | 2012-146331 | 8/2012 |
| WO | WO 2011/122207 A1 | 10/2011 |
| WO | WO 2012/009460 A2 | 1/2012 |
| WO | WO 2012/116769 A1 | 9/2012 |
| WO | WO 2012/144123 A1 | 10/2012 |

OTHER PUBLICATIONS

International Search Report and Written Opinion dated Feb. 3, 2015, in corresponding PCT International Application.

* cited by examiner

ELECTRONIC APPARATUS ENCLOSURE DEVICE AND ELECTRONIC APPARATUS COOLING SYSTEM

CROSS-REFERENCE TO RELATED PATENT APPLICATIONS

This application is a National Stage Entry of International Application No. PCT/JP2014/005742, filed Nov. 14, 2014, which claims priority from Japanese Patent Application No. 2013-239975, filed Nov. 20, 2013. The entire contents of the above-referenced applications are expressly incorporated herein by reference.

TECHNICAL FIELD

The present invention relates to an electronic apparatus enclosure device and an electronic apparatus cooling system and relates to, for example, a technology for cooling an electronic apparatus accommodated in a rack.

BACKGROUND ART

In recent years, with the expansion of internet service, the role of a data center in which a server that perform an information process and a network apparatus are gathered in one place increases. Further, with the increase of the amount of information processed by the data center, the electric power consumed by the data center increases.

In particular, the electronic apparatus is accommodated in the data center and an air-conditioning equipment for cooling the electronic apparatus consumes a large percentage of the total electric power consumed by the data center. In the electronic apparatus, a plurality of electronic components including a heat-producing element such as a central processing unit (CPU), a Multi-chip Module (MCM), or the like are used. Such air-conditioning equipment consumes about one half of the total electric power consumed by the data center.

Accordingly, it is requested to reduce the electric power used for air conditioning in the data center. For this purpose, a method in which heat exhausted from a rack main body of an electronic apparatus enclosure device for accommodating the electronic apparatus is directly transported to the outside of the building and discharged to the outside air without using the air-conditioning equipment is used on a trial basis. By adopting this method, the electric power used for air conditioning in the data center can be reduced.

Further, as a method for transporting the heat exhausted from the rack main body of the electronic apparatus enclosure device to the outside of the building, a method using a phase change phenomenon of refrigerant is known besides a method in which cold water supplied from the outside is circulated by a pump.

In the method using the phase change phenomenon of refrigerant, refrigerant is circulated by repeating an evaporation phenomenon which occurs when a phase of refrigerant changes from liquid to vapor and a condensation phenomenon which occurs when a phase of refrigerant changes from vapor to liquid (this repeating motion is also called an evaporation-condensation cycle). In the method using the phase change phenomenon of refrigerant, refrigerant is naturally circulated without using an external driving force such as a pump or the like and a large amount of heat transfer can be realized because latent heat is used. Therefore, it is expected to contribute to the reduction of the electric power used for air conditioning in the data center.

The above-mentioned method using the phase change phenomenon of refrigerant (it is also called a refrigerant natural circulation cooling method) is disclosed in for example, patent literature 1.

In the refrigerant natural circulation cooling method disclosed in patent literature 1, heat exhausted from the electronic apparatus mounted in a server rack 26 is transported to an evaporator 34 mounted on a rack back face via refrigerant. The heat that is exhausted from the electronic apparatus and transported to the evaporator 34 is consumed as the vaporization heat when the phase of the refrigerant changes from liquid to vapor and the heat is transported to cooling towers 38 and 76 located outside the building. As a result, the temperature of the server room can be reduced. Further, a flexible vapor pipe 78 and a flexible liquid pipe 80 are connected to the evaporator 34. The vapor pipe 78 is provided to transport vapor. The liquid pipe 80 is provided to transport liquid.

CITATION LIST

Patent Literature

[PTL 1] Japanese Patent Application Laid-Open No. 2011-165707

SUMMARY OF INVENTION

Technical Problem

However, in the technology described in patent literature 1, after a refrigerant natural circulation cooling system is conveyed or transported or after a process for evacuating the air in the evaporator 34 is performed for maintenance work or the like, the refrigerant natural circulation cooling system has the following problems at an initial stage of the operation of the cooling system.

A first problem is a problem in which the cooling performance is lowered at the initial stage of the operation of the cooling system.

Namely, in the technology described in patent literature 1, when the evaporator 34 mounted on the back face of the server rack 26 receives the heat exhausted from the electronic apparatus, the phase of the refrigerant changes from liquid to vapor and the vapor (vapor-phase refrigerant) flows to the cooling towers 38 and 76 through the vapor pipe 78. Further, when the vapor-phase refrigerant is cooled in the cooling towers 38 and 76, the refrigerant changes to refrigerant liquid (liquid-phase refrigerant) and the liquid-phase refrigerant flows back to the evaporator 34 again from the cooling towers 38 and 76 through the liquid pipe 80.

Here, it is assumed that the evaporator 34 includes a plurality of heat receiving portions (not shown) arranged on the back face of the server rack 26. In this operation state, the refrigerant liquid is equally distributed to a plurality of the heat receiving portions. A plurality of the heat receiving portions can receive the heat exhausted from the electronic apparatus from the whole back face of the server rack 26 in a vertical (upper and lower) direction. As a result, a large amount of the heat exhausted from the electronic apparatus can be transported to the cooling towers 38 and 76.

However, when the natural circulation of the refrigerant is realized by the phase change of the refrigerant, it is necessary to evacuate the air in the cooling system and put it under a saturated vapor pressure environment. For this purpose, after refrigerant is poured into the cooling system, a process for evacuating the air in the cooling system is performed by using a vacuum pump (not shown). In this case, the refrigerant poured into the cooling system flows in a suction direction through the vapor pipe 78 together with the air in the cooling system. For this reason, in an initial state of the operation of the cooling system after the process for evacuating the air in the cooling system is performed, a large amount of the refrigerant liquid is accumulated in the heat receiving portion located in a lower part of the server rack 26 in a vertical direction among a plurality of the heat receiving portions. When the cooling system is in such state, an excessive amount of refrigerant liquid is accumulated in the heat receiving portion located in the vertically lower part of the server rack 26. When the conveying distance from the server rack 26 to the cooling towers 38 and 76 is long, this accumulated liquid cannot reach the cooling towers 36 and 78 and flows downward in the vapor pipe 78 again. At this time, the accumulated liquid flowing downward collides with the vapor flowing upward. Accordingly, the flow of the vapor is blocked and whereby, a heat transport capacity is reduced.

Further, at an initial state stage of the operation of the cooling system, because no refrigerant exists in the heat receiving portion arranged in a vertically upper part of the server rack 26, the change in the phase of refrigerant does not occur. For this reason, the upper portion of the server rack 26 discharges the heat exhausted from the electronic apparatus to the outside of the server rack 26 directly. As a result, the cooling performance of the cooling system is lowered.

A second problem is a problem in which it takes much time until the cooling system operates at a maximum rate at which the maximum amount of heat can be transported.

Namely, the refrigerant liquid is supplied from the cooling towers 38 and 76 to the evaporator 34 through the liquid pipe 80. In the evaporator 34, the refrigerant liquid is supplied to a plurality of heat receiving portions in order from the uppermost one to the lowermost one in the vertical direction of the server rack 26. Therefore, the refrigerant accumulated in the heat receiving portion located in a vertically lower part of the server rack 26 at the initial state stage of the operation of the cooling system is equally distributed to a plurality of the heat receiving portions over time. At this time, a plurality of the heat receiving portions can receive the heat exhausted from the electronic apparatus from the whole back face of the server rack 26 in a vertical (upper and lower) direction. As a result, a maximum amount of heat exhausted from the electronic apparatus can be transported to the cooling towers 38 and 76. However, because the accumulated liquid exists in the vapor pipe 78, the flow of the vapor flowing upward is blocked by the accumulated liquid. As a result, the refrigerant is slowly circulated and it takes much time until all the heat receiving portions work properly.

The present invention is made in view of the above mentioned situation and an object of the present invention is to provide a technology in which refrigerant can be efficiently transported in a short time.

Solution to Problem

An electronic apparatus enclosure device of the present invention includes a rack which accommodates an electronic apparatus having a heat-producing component, a plurality of heat receiving portions which are arranged on a back face of the rack along a vertical direction and receive heat of the electronic apparatus, a heat dissipation portion which dissipates the heat of the electronic apparatus that is received by each of a plurality of the heat receiving portions, a vapor pipe connected to each of a plurality of the heat receiving portions, a liquid pipe which connects the heat dissipation portion and each of a plurality of the heat receiving portions, a bypass pipe which connects the vapor pipe and the liquid pipe, a valve which opens and closes a flow path of the bypass pipe, a first connection portion which connects the vapor pipe and the bypass pipe, and a second connection portion which connects the liquid pipe and the bypass pipe, wherein the first connection portion is disposed at a position higher than that of the second connection portion.

An electronic apparatus cooling system of the present invention includes a rack which accommodates an electronic apparatus having a heat-producing component, a plurality of heat receiving portions which are arranged on a back face of the rack along a vertical direction and receive heat of the electronic apparatus, a heat dissipation portion which dissipates the heat of the electronic apparatus that is received by each of a plurality of the heat receiving portions, a vapor pipe which connects the heat dissipation portion and each of a plurality of the heat receiving portions, a liquid pipe which connects the heat dissipation portion and each of a plurality of the heat receiving portions, a bypass pipe which connects the vapor pipe and the liquid pipe, a valve which opens and closes a flow path of the bypass pipe, a first connection portion which connects the vapor pipe and the bypass pipe, and a second connection portion which connects the liquid pipe and the bypass pipe, wherein the first connection portion is disposed at a position higher than that of the second connection portion.

Advantageous Effects of Invention

By using the electronic apparatus enclosure device and the electronic apparatus cooling system according to the present invention, refrigerant can be efficiently transported in a short time.

DESCRIPTION OF EMBODIMENTS

First Exemplary Embodiment

Figure 1:
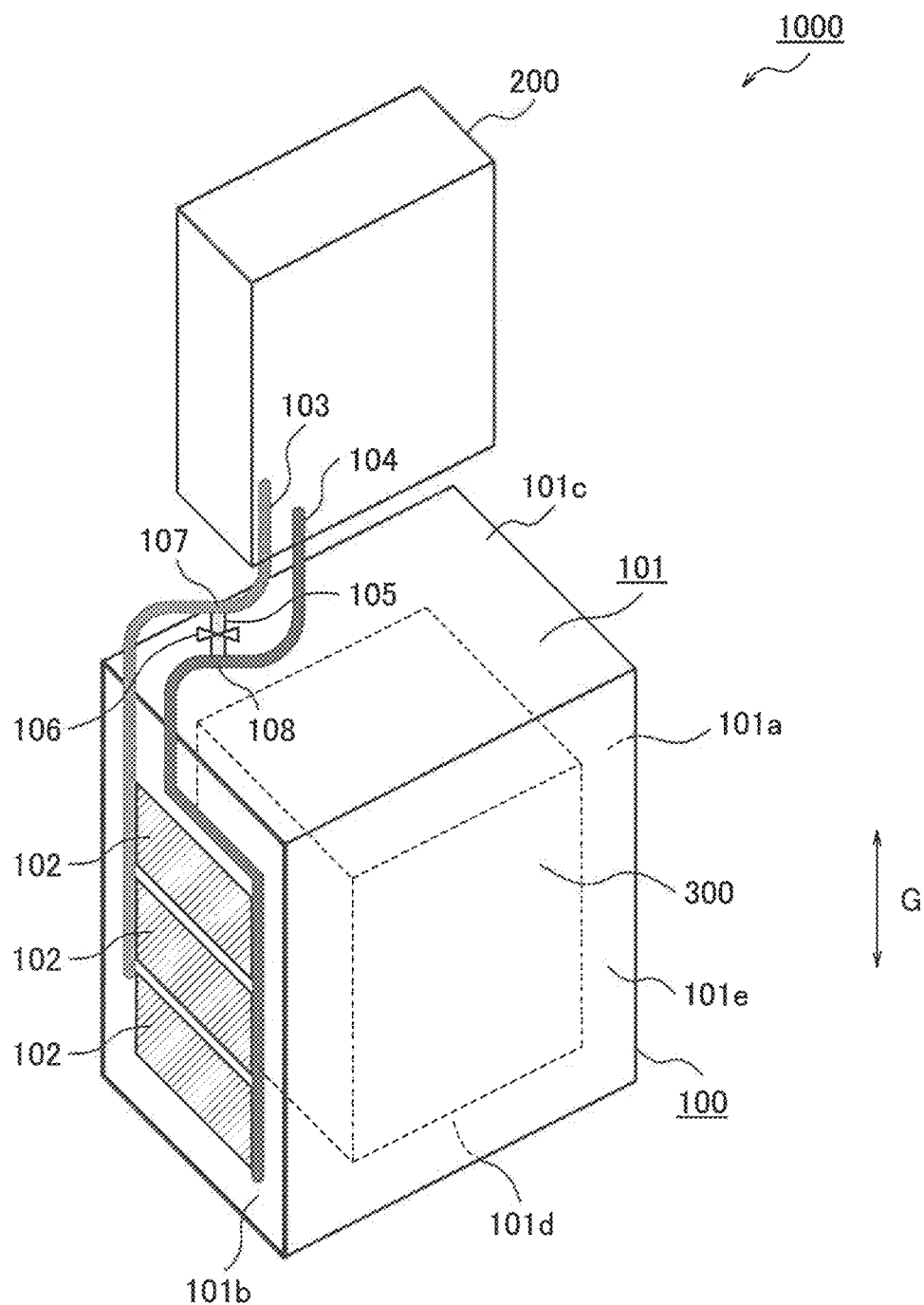
FIG. 1 is a perspective view schematically showing a structure of an electronic apparatus cooling system according to a first exemplary embodiment of the present invention.
Figure 2:
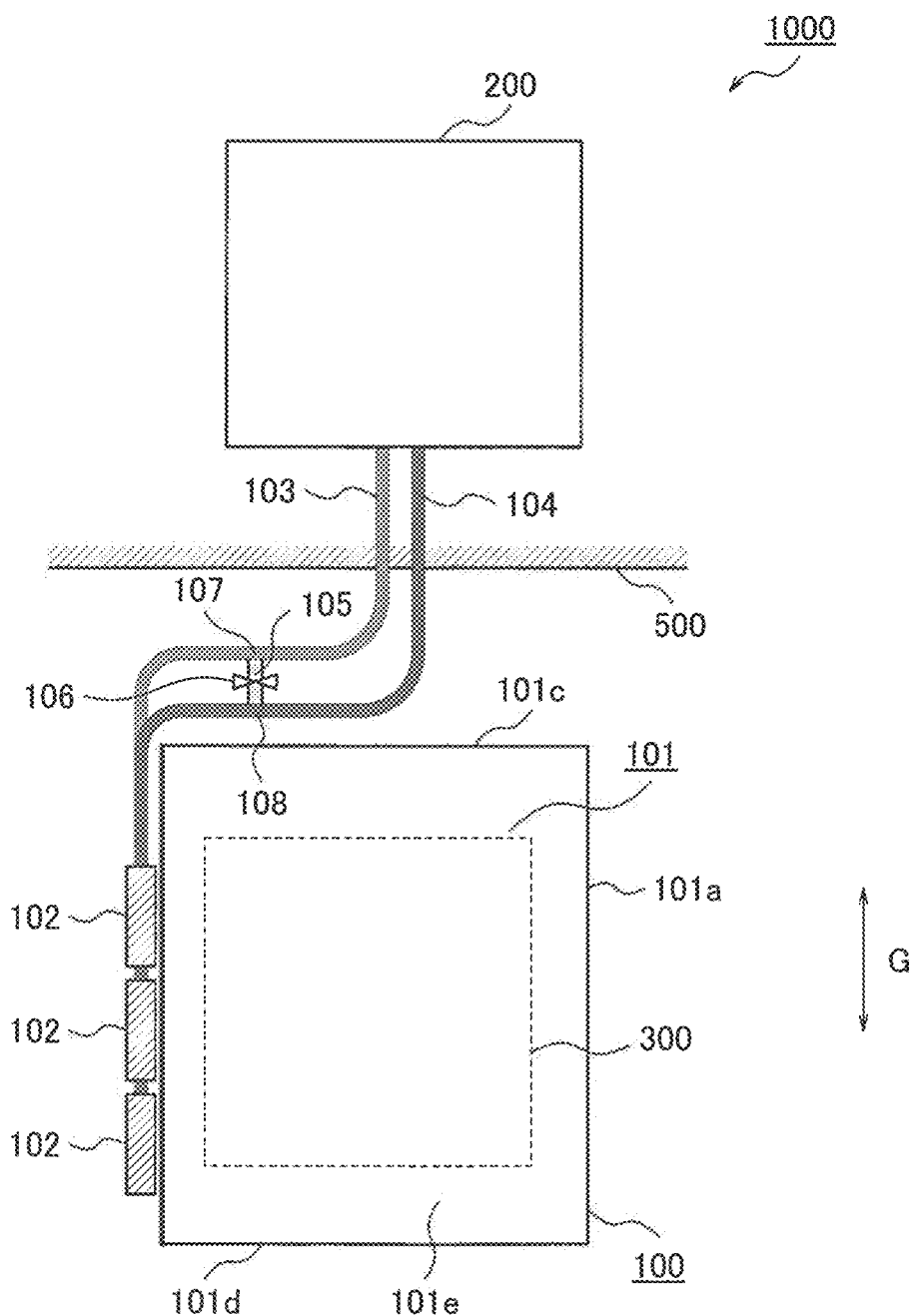
FIG. 2 is a side view schematically showing a structure of an electronic apparatus cooling system according to a first exemplary embodiment of the present invention.

A structure of an electronic apparatus cooling system 1000 according to a first exemplary embodiment will be described. FIG. 1 is a perspective view schematically showing a structure of the electronic apparatus cooling system 1000. FIG. 2 is a side view schematically showing a structure of the electronic apparatus cooling system 1000. Further, for convenience of explanation, a vertical direction G is shown in FIG. 1 and FIG. 2.

As shown in FIG. 1 and FIG. 2, the electronic apparatus cooling system 1000 includes an electronic apparatus enclosure device 100 and a heat dissipation portion 200.

As shown in FIG. 1 and FIG. 2, the electronic apparatus enclosure device 100 can accommodate an electronic apparatus 300. As shown in FIG. 1 and FIG. 2, the electronic apparatus enclosure device 100 includes a server rack 101, a plurality of heat receiving portions 102, a vapor pipe 103, a liquid pipe 104, a bypass pipe 105, a valve 106, a first connection portion 107, and a second connection portion 108. The server rack 101 corresponds to the rack of the present invention. As shown in FIG. 1 and FIG. 2, the server rack 101 includes a server rack front face 101a, a server rack back face 101b, a server rack top face 101c, a server rack bottom face 101d, and two server rack side faces 101e.

The electronic apparatus 300 has a heat-producing component such as a CPU, a MCM, or the like. For example, the electronic apparatus 300 is a network apparatus or the like such as a server, a router, or the like. The electronic apparatus 300 performs various data processing in the electronic apparatus enclosure device 100. When the electronic apparatus 300 performs the data processing, the heat-producing component used in the electronic apparatus 300 generates heat. For this reason, the electronic apparatus 300 inhales external air from the server rack front face 101a and exhausts it to a server rack back face 101b side.

The server rack 101 is formed in a box shape and accommodates the electronic apparatus 300 having the heat-producing component. For example, aluminum alloy or the like is used as a material of the server rack 101.

As shown in FIG. 1 and FIG. 2, a plurality of the heat receiving portions 102 are arranged on the server rack back face 101b along the vertical direction G. A plurality of the heat receiving portions 102 are connected to the heat dissipation portion 200 via the vapor pipe 103 and the liquid pipe 104. Each of a plurality of the heat receiving portions 102 includes a container and stores refrigerant in this container in a shielded state. Further, each of a plurality of the heat receiving portions 102 receives heat of the heat dissipation portion 200 via refrigerant. Namely, each of a plurality of the heat receiving portions 102 receives heat exhausted to the server rack back face 101b side by the electronic apparatus 300 via refrigerant as the heat of the electronic apparatus 300. In FIG. 1 and FIG. 2, three heat receiving portions 102 are shown as an example. However, in the present invention, the number of the heat receiving portions 102 may be two or more than four.

Refrigerant is made of for example, a high-polymer material or the like. Refrigerant vaporizes under a high temperature condition and liquefies under a low temperature condition. Refrigerant with a low boiling point such as for example, hydrofluorocarbon, hydro fluoro ether, or the like is used as refrigerant. Refrigerant circulates between a plurality of the heat receiving portions 102 and the heat dissipation portion 200 through the vapor pipe 103 and the liquid pipe 104 in a sealed structure (hereinafter, referred to as a cooling structure) composed of a plurality of the heat receiving portions 102, the heat dissipation portion 200, the vapor pipe 103, the liquid pipe 104, and the bypass pipe 105. By evacuating the air in the sealed space, a pressure in a plurality of the heat receiving portions 102, the heat dissipation portion 200, the vapor pipe 103, and the liquid pipe 104 is set to a saturated vapor pressure.

In order to feed refrigerant into the electronic apparatus cooling system 1000 according to this exemplary embodiment, first, refrigerant is poured into the space of the cooling structure. Next, the air in the space of the cooling structure is evacuated by using a vacuum pump (not shown) or the like and refrigerant is sealed in the space. As a result, the pressure in the space of the cooling structure is set to a saturated vapor pressure and the boiling point of refrigerant sealed in the space is lowered to an ordinary temperature. When the cooling structure is in an ordinary temperature environment and the heat-producing component (not shown) of the electronic apparatus 300 generates heat, refrigerant boils and vapor is generated. As a result, the cooling structure functions as a cooling module and heat of the electronic apparatus 300 can be removed.

As shown in FIG. 1 and FIG. 2, the vapor pipe 103 connects the heat dissipation portion 200 and each of a plurality of the heat receiving portions 102. Further, the vapor pipe 103 is provided for flowing the refrigerant vaporized by heat in the heat receiving portion 102 to the heat dissipation portion 200 from each of a plurality of the heat receiving portions 102. The vapor pipe 103 is made of for example, a metal such as an aluminum alloy or the like, a rubber, or the like.

As shown in FIG. 1 and FIG. 2, the liquid pipe 104 connects the heat dissipation portion 200 and each of a plurality of the heat receiving portions 102. Further, the liquid pipe 104 is provided for flowing the refrigerant liquefied in the heat dissipation portion 200 to each of a plurality of the heat receiving portions 102 from the heat dissipation portion 200. The liquid pipe 104 is made of for example, a metal such as an aluminum alloy or the like, a rubber, or the like.

Further, a coupler or a flange is used for the connection of the vapor pipe 103 and the liquid pipe 104.

As shown in FIG. 1 and FIG. 2, the bypass pipe 105 connects the vapor pipe 103 and the liquid pipe 104. The bypass pipe 105 is made of for example, a metal such as an aluminum alloy or the like, a rubber, or the like.

As shown in FIG. 1 and FIG. 2, the valve 106 is disposed at a midpoint of the bypass pipe 105. The valve 106 opens and closes a flow path of the bypass pipe 105.

As shown in FIG. 1 and FIG. 2, the first connection portion 107 connects the vapor pipe 103 and the bypass pipe 105. The first connection portion 107 is disposed at a position higher than that of the second connection portion 108 in the vertical direction G.

As shown in FIG. 1 and FIG. 2, the second connection portion 108 connects the liquid pipe 104 and the bypass pipe 105. The second connection portion 108 is disposed at a position lower than that of the first connection portion 107 in the vertical direction G.

As shown in FIG. 1 and FIG. 2, the heat dissipation portion 200 is disposed at a position higher than that of the electronic apparatus enclosure device 100 in the vertical direction G. Further, as shown in FIG. 2, for example, the heat dissipation portion 200 is installed in a space above a ceiling 500 of a room of a data center or the like. Thus, by installing the heat dissipation portion 200 in the space above the ceiling 500, a plurality of the heat receiving portions 102 can be easily disposed at a position lower than that of the heat dissipation portion 200 in the vertical direction G. The heat dissipation portion 200 is connected to each of a plurality of the heat receiving portions 102 via the vapor pipe 103 and the liquid pipe 104. Further, the heat dissipation portion 200 dissipates heat of the electronic apparatus 300 that is received by a plurality of the heat receiving portions 102. In this case, for example, an air-cooled type heat dissipation portion or a water heat exchange type heat dissipation portion can be used as the heat dissipation portion 200.

The structure of the electronic apparatus cooling system 1000 has been described above.

Next, the operation of the electronic apparatus cooling system 1000 will be described.

When the electronic apparatus 300 operates, the heat-producing component (not shown) of the electronic apparatus 300 generates heat. The electronic apparatus 300 exhausts heat generated by the heat-producing component to the inside of the server rack 101 as the exhaust heat.

Each of a plurality of the heat receiving portions 102 absorbs the heat exhausted by the electronic apparatus 300 and thereby, receives the heat generated by the heat-producing component of the electronic apparatus 300.

Figure 3:
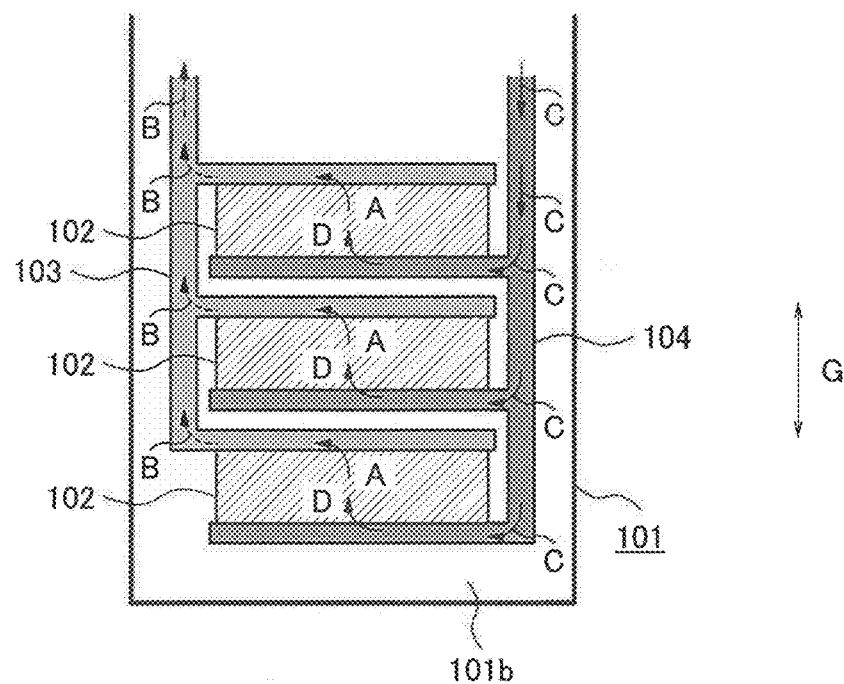
FIG. 3 is an explanatory drawing showing a flow of refrigerant around a heat receiving portion of an electronic apparatus cooling system according to a first exemplary embodiment of the present invention.
Figure 4:
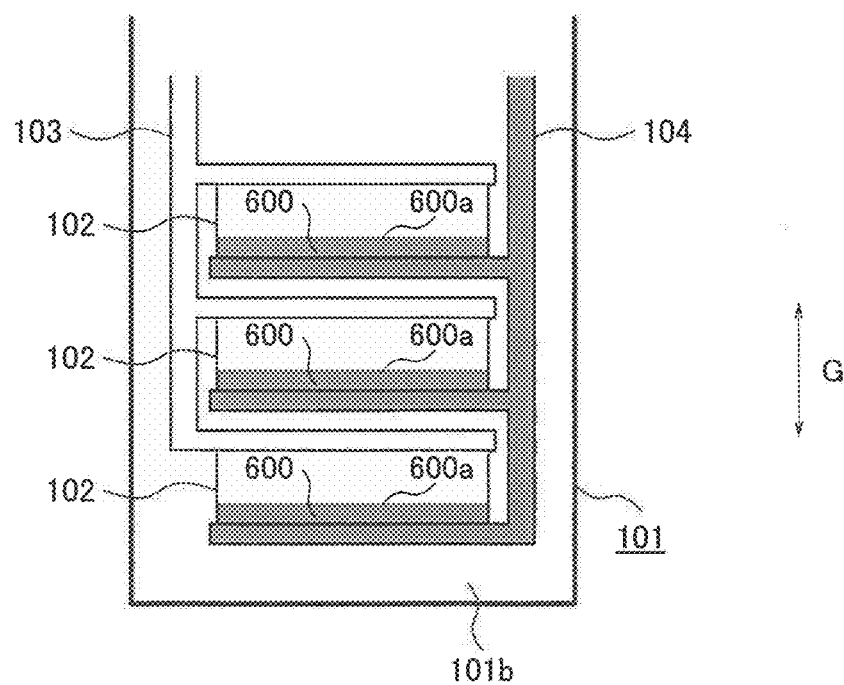
FIG. 4 is an explanatory drawing showing a flow of refrigerant around a heat receiving portion of an electronic apparatus cooling system according to a first exemplary embodiment of the present invention.
Figure 5:
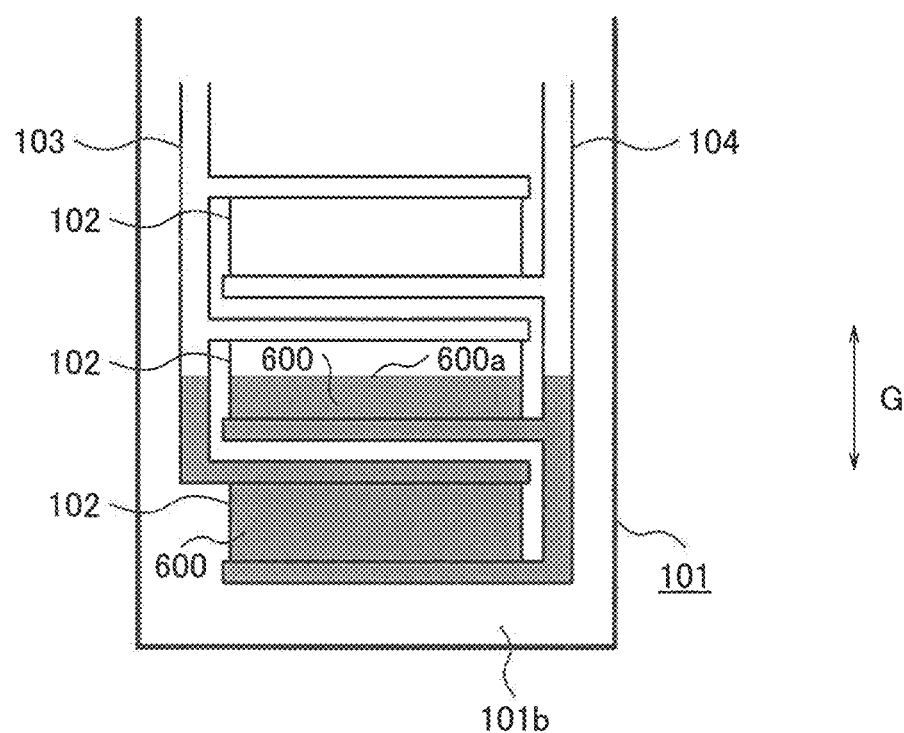
FIG. 5 is an explanatory drawing showing a flow of refrigerant around a heat receiving portion of an electronic apparatus cooling system according to a first exemplary embodiment of the present invention.

FIGS. 3 to 5 are explanatory drawings showing a flow of refrigerant around the heat receiving portion 102 of the electronic apparatus cooling system 1000. Further, for convenience of explanation, a vertical direction G is shown in FIG. 3 to FIG. 5.

When each of a plurality of the heat receiving portions 102 receives the heat generated by the heat-producing component of the electronic apparatus 300, a phase of the refrigerant accumulated in each heat receiving portion 102 changes from liquid to vapor. Namely, liquid-phase refrigerant changes to vapor-phase refrigerant. As indicated by an arrow A in FIG. 3, the vapor-phase refrigerant moves upward inside the each heat receiving portion 102 in the vertical direction G and flows into the inside of the vapor pipe 103. Next, as indicated by an arrow B in FIG. 3, the vapor-phase refrigerant flows upward in the vapor pipe 103 in the vertical direction G and flows into the heat dissipation portion 200 (not shown in FIG. 3). Further, the flow of refrigerant indicated by the arrow A and the arrow B in FIG. 3 may be also called a vapor flow.

When the vapor-phase refrigerant flows into the heat dissipation portion 200, the vapor-phase refrigerant is cooled by the heat dissipation portion 200 and the phase of the refrigerant changes from vapor to liquid. Namely, the vapor-phase refrigerant changes to the liquid-phase refrigerant. Next, as indicated by an arrow C in FIG. 3, the liquid-phase refrigerant in the heat dissipation portion 200 flows into the inside of the liquid pipe 104 and flows downward in the liquid pipe 104 in the vertical direction G. As indicated by an arrow D in FIG. 3, the liquid-phase refrigerant in the liquid pipe 104 flows into an evaporation portion 102 again. Further, the refrigerant flow indicated by the arrow C and the arrow D in FIG. 3 may be also called liquid return.

Thus, the refrigerant is circulated between each of a plurality of the heat receiving portions 102 and the heat dissipation portion 200 while changing the phase of the refrigerant (from/to liquid to/from vapor) and whereby, the heat generated by the heat-producing component of the electronic apparatus 300 can be cooled.

FIG. 4 shows a state after the liquid-phase refrigerant in the liquid pipe 104 flows into the evaporation portion 102 again. As shown in FIG. 4, liquid-phase refrigerant 600 is accumulated in each heat receiving portion 102 so as to form a liquid surface 600a.

By the way, there is a case in which a large amount of the liquid-phase refrigerant 600 is accumulated in the heat receiving portion 102 located in a lower part of the server rack 101 in the vertical direction G after the whole electronic apparatus cooling system 1000 or the electronic apparatus enclosure device 100 is conveyed or transported or after a process for evacuating the air in the cooling structure is performed for maintenance work or the like.

FIG. 5 shows a state in which the liquid-phase refrigerant 600 is unequally accumulated in the heat receiving portions 102 and a large amount of the liquid-phase refrigerant 600 is accumulated in the heat receiving portion 102 located in the lower part of the server rack 101 in the vertical direction G. As shown in FIG. 5, a large amount of the liquid-phase refrigerant 600 is accumulated in the heat receiving portion 102 located in the lower part of the server rack 101 in the vertical direction G. In an example shown in FIG. 5, the heat receiving portion 102 located in the lower part of the server rack 101 in the vertical direction G fills with the liquid-phase refrigerant 600. Further, a proper amount of the liquid-phase refrigerant 600 is accumulated in the heat receiving portion 102 located in the middle part of the server rack 101 in the vertical direction G so as to form the liquid surface 600a. The liquid-phase refrigerant 600 is not accumulated in the heat receiving portion 102 located in the uppermost part of the server rack 101 in the vertical direction G.

For this reason, when the operation of the electronic apparatus cooling system 1000 is started, it is necessary to operate only the heat receiving portion 102 located in the lowermost part of the server rack 101 in the vertical direction G, heat up the heat receiving portion 102 located in the lowermost part of the server rack 101 in the vertical direction G by a heater, a warm air fan, or the like, or perform another method in order to forcibly circulate the liquid-phase refrigerant accumulated in the lower part of the server rack 101 (especially, the heat receiving portion 102 located in the lowermost part of the server rack 101 in the vertical direction G). That is because only when a state in which the liquid-phase refrigerant 600 is accumulated in all the heat receiving portions 102 so as to form the liquid surface 600a as shown in FIG. 4 is maintained, the heat exhausted from the electronic apparatus 300 installed at the upper part of the server rack 101 can be received by the heat receiving portion 102. Namely, if this state cannot be realized, the heat exhausted from the electronic apparatus 300 cannot be efficiently received by the heat receiving portion 102 and the electric power consumption of the air-conditioning equipment cannot be reduced.

Figure 6:
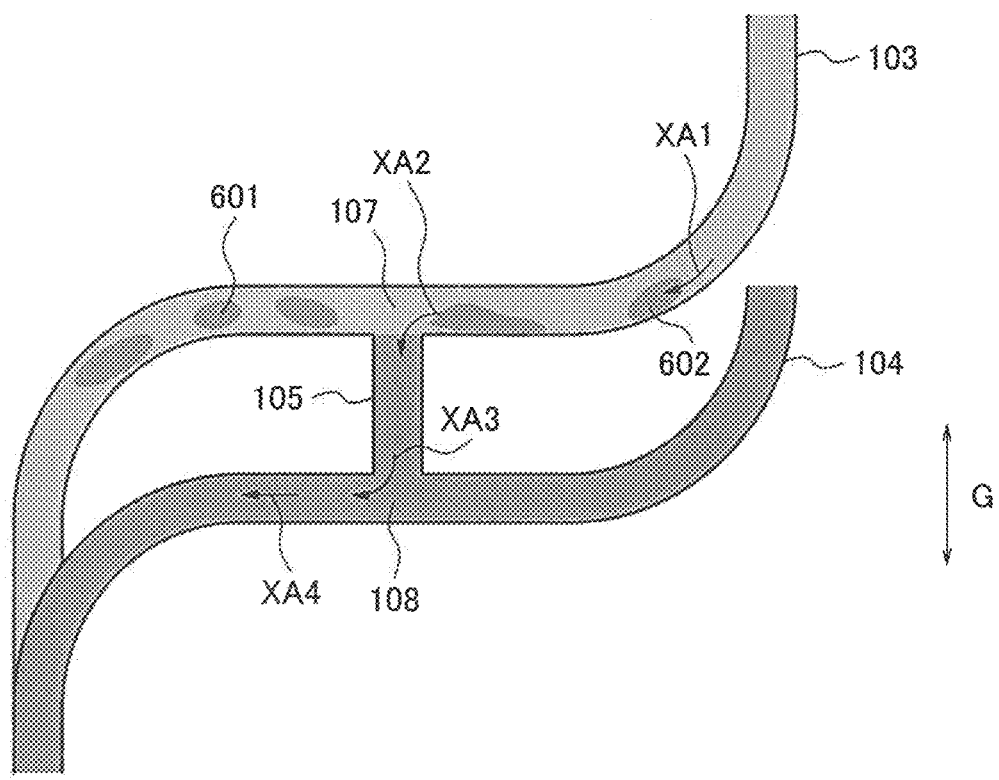
FIG. 6 is an enlarged transparent perspective view schematically showing a structure around a vapor pipe, a liquid pipe, and a bypass pipe of an electronic apparatus cooling system according to a first exemplary embodiment of the present invention.
Figure 7:
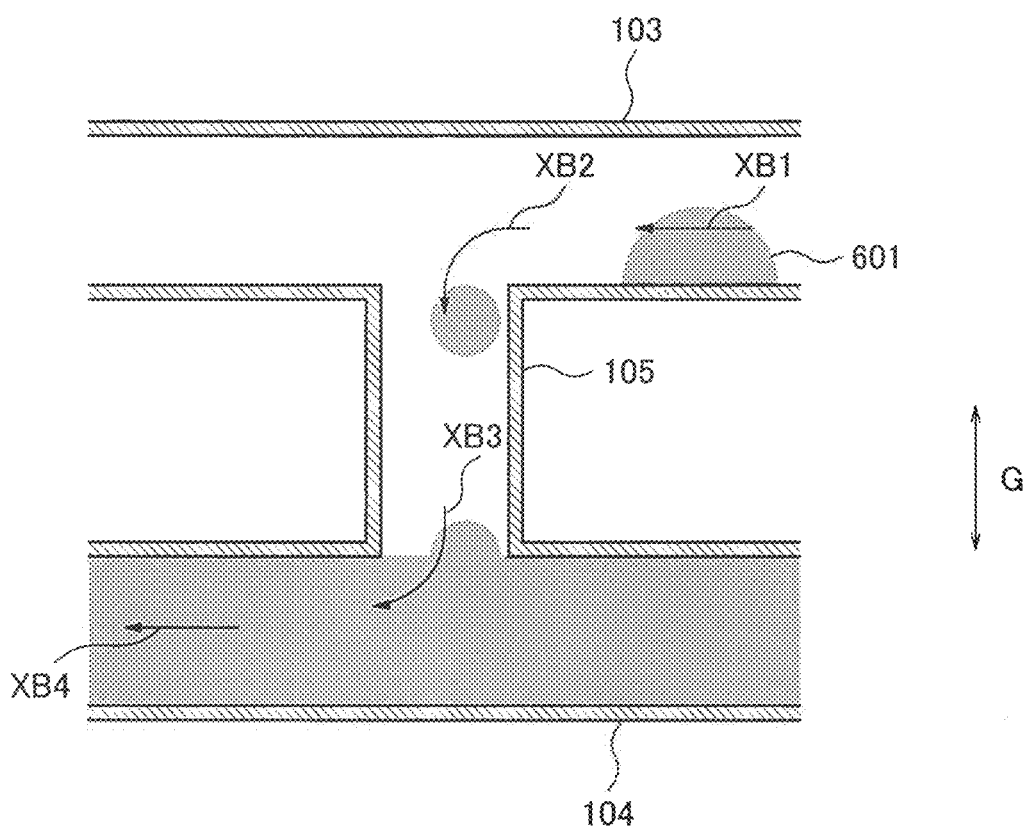
FIG. 7 is an enlarged sectional view schematically showing a structure around a vapor pipe, a liquid pipe, and a bypass pipe of an electronic apparatus cooling system according to a first exemplary embodiment of the present invention.

FIG. 6 is an enlarged transparent perspective view schematically showing a structure around the vapor pipe 103, the liquid pipe 104, and the bypass pipe 105 of the electronic apparatus cooling system 1000 according to the exemplary embodiment of the present invention. FIG. 7 is an enlarged sectional view schematically showing a structure around the vapor pipe 103, the liquid pipe 104, and the bypass pipe 105 of the electronic apparatus cooling system 1000 according to the exemplary embodiment of the present invention. Further, for convenience of explanation, the vertical direction G is shown in FIG. 6 and FIG. 7.

As described above, when the liquid-phase refrigerant accumulated in the lower part of the server rack 101 (especially, the heat receiving portion 102 located in the lowermost part of the server rack 101 in the vertical direction G) is forcibly circulated, as shown in FIG. 6 and FIG. 7, the liquid-phase refrigerant accumulated in the lower part of the server rack 101 flows upward with vapor through the vapor pipe 104 as the accumulated liquid 601 of the liquid-phase refrigerant 600.

As shown in FIG. 6 and FIG. 7, the bypass pipe 105 connects the vapor pipe 103 and the liquid pipe 104. Further, the first connection portion 107 connecting the vapor pipe 103 and the bypass pipe 105 is disposed at a position higher than that of the second connection portion 108 connecting the liquid pipe 104 and the bypass pipe 105 in the vertical direction G.

Accordingly, as shown in FIG. 6 and FIG. 7, when the valve 106 (not shown in FIG. 6 and FIG. 7 and refer to FIG. 1 and FIG. 2) attached to the bypass pipe 105 is opened, the accumulated liquid 601 of the liquid refrigerant whose gravity is large compared to the vapor-phase refrigerant flows back to the liquid pipe 104 from the vapor pipe 103 through the bypass pipe 105. As shown by arrows XA1 to XA4 in FIG. 6 and arrows XB1 to XB4 in FIG. 7, a liquid return of the refrigerant occurs when the refrigerant does not reach the heat dissipation portion 200 disposed outside the server rack 101 and the refrigerant flows back to the liquid pipe 104 from the vapor pipe 103 through the bypass pipe 105.

When the liquid-phase refrigerant is received by all the heat receiving portions 102 as shown in FIG. 4, the valve 106 is closed. As a result, the vapor pipe 103 is disconnected from the liquid pipe 104. As a result, the refrigerant (especially, the vapor-phase refrigerant) is prevented from flowing into the liquid pipe 104 from the vapor pipe 103 through the bypass pipe 105.

Next, an example of a method for opening and closing the valve 106 will be described below. The difference between the temperature of the vapor pipe 103 and the temperature of the liquid pipe 104 is monitored and when the temperature difference is stable, the valve 106 is closed. Alternatively, the temperature of an intake side and the temperature of an exhaust side around the center part of each heat receiving portion 102 are monitored and when the difference between the temperature of the intake side and the temperature of the exhaust side is generated after each heat receiving portion 102 starts to operate, the valve 106 is closed.

As described above, the electronic apparatus enclosure device 100 according to the first exemplary embodiment of the present invention includes the server rack 101, a plurality of the heat receiving portions 102, the vapor pipe 103, the liquid pipe 104, the bypass pipe 105, the valve 106, the first connection portion 107, and the second connection portion 108.

The server rack 101 accommodates the electronic apparatus 300 having a heat-producing component. A plurality of the heat receiving portions 102 are arranged on the back face of the server rack 101 along the vertical direction G. Further, a plurality of the heat receiving portions 102 receive the heat of the electronic apparatus 300.

The vapor pipe 103 connects the heat dissipation portion 200 and each of a plurality of the heat receiving portions 102. Further, the heat dissipation portion 200 dissipates the heat of the electronic apparatus 300 that is received by each of a plurality of the heat receiving portions 102. The liquid pipe 104 connects the heat dissipation portion 200 and each of a plurality of the heat receiving portions 102. Further, the vapor pipe 103 is provided for flowing the refrigerant vaporized by the heat in the heat receiving portion 102 to the heat dissipation portion 200 from each of a plurality of the heat receiving portions 102. The liquid pipe 104 is provided for flowing the refrigerant liquefied by the heat dissipation portion 200 to each of a plurality of the heat receiving portions 102 from the heat dissipation portion 200.

The bypass pipe 105 connects the vapor pipe 103 and the liquid pipe 104. The valve 106 opens and closes the flow path of the bypass pipe 105. The first connection portion 107 connects the vapor pipe 103 and the bypass pipe 105. The second connection portion 108 connects the liquid pipe 104 and the bypass pipe 105. The first connection portion 107 is disposed at a position higher than that of the second connection portion 108.

Thus, in the electronic apparatus enclosure device 100 according to the first exemplary embodiment of the present invention, the bypass pipe 105 connects the vapor pipe 103 and the liquid pipe 104. The first connection portion 107 connecting the vapor pipe 103 and the bypass pipe 105 is disposed at a position higher than that of the second connection portion 108 connecting the liquid pipe 104 and the bypass pipe 105 in the vertical direction G.

Therefore, by opening the valve 106 attached to the bypass pipe 105, the liquid refrigerant whose gravity is large compared to the vapor-phase refrigerant can flow back to the liquid pipe 104 from the vapor pipe 103 through the bypass pipe 105. Further, the liquid return of the refrigerant occurs when the refrigerant does not reach the heat dissipation portion 200 and the refrigerant can flow back to the liquid pipe 104 from the vapor pipe 103 through the bypass pipe 105. Whereby, the liquid-phase refrigerant can flow to all the heat receiving portions 102. As a result, the liquid-phase refrigerant is accumulated in all the heat receiving portions 102 so as to form the liquid surface 600a.

The refrigerant accumulated in the lower part of the server rack 101 (especially, the heat receiving portion 102 located in the lowermost part of the server rack 101 in the vertical direction G) can flow back to the liquid pipe 104 from the vapor pipe 103 through the bypass pipe 105. Therefore, the refrigerant can be efficiently transported to the inside of the apparatus in a short time. As a result, for example, performance degradation at an initial stage of the operation of the electronic apparatus cooling system 1000 can be avoided and the time taken before the electronic apparatus cooling system 1000 operates at a maximum rate at which the maximum amount of heat can be transported can be substantially reduced.

As mentioned above, by using the electronic apparatus enclosure device 100 according to the first exemplary embodiment of the present invention, cooling performance degradation at an initial stage of the operation of the cooling system can be avoided. The reason is as follows. Namely, the liquid return of the refrigerant occurs when the accumulated liquid flowing upwards with vapor does not reach the heat dissipation portion 200 and the refrigerant flows back to the liquid pipe 104 through the bypass pipe 105. Therefore, the collision of the vapor and the liquid return can be avoided and the flow of the vapor is not obstructed.

Further, the refrigerant flowing back to the liquid pipe 104 through the bypass pipe 105 flows into the heat receiving portions 102 of the server rack 101 in order from the uppermost one to the lowermost one. The heat receiving portion 102 starts to receive the heat exhausted by the electronic apparatus 300. For this reason, a state in which the refrigerant is not accumulated at all in the heat receiving portion 102 located in the upper part of the server rack 101 can be avoided. As a result, cooling performance degradation of the electronic apparatus cooling system 1000 can be avoided.

Further, by using the electronic apparatus enclosure device 100 according to the first exemplary embodiment of the present invention, the time taken before the cooling system operates at a maximum rate at which the maximum amount of heat can be transported can be substantially reduced. The reason is as follows. Namely, in each of a plurality of the heat receiving portions 102, the liquid-phase refrigerant accumulated in the lower part of the server rack 101 absorbs the heat exhausted by the electronic apparatus 300. As a result, the liquid-phase refrigerant changes to the vapor-phase refrigerant and vapor is generated. This vapor is transported to the heat dissipation portion 200 through the vapor pipe 103. In the heat dissipation portion 200, the vapor-phase refrigerant changes to the liquid-phase refrigerant again by the condensation of vapor. Because the bypass pipe 105 connects the vapor pipe 103 and the liquid pipe 104, the liquid-phase refrigerant generated in the heat dissipation portion 200 does not flow into the heat receiving portions 102 of the server rack 101 in order from the uppermost one to the lowermost one and the liquid-phase refrigerant flowing upward together with vapor through the bypass pipe 105 located above the server rack 101 can flow back to the heat receiving portion 102 located in the upper part of the server rack 101. For this reason, all the heat receiving portions 102 can be filled with the liquid-phase refrigerant in a short time. As a result, the electronic apparatus cooling system 1000 can operate at a maximum rate at which the maximum amount of heat can be transported.

The electronic apparatus cooling system 1000 according to the first exemplary embodiment of the present invention includes the server rack 101, a plurality of the heat receiving portions 102, the heat dissipation portion 200, the vapor pipe 103, the liquid pipe 104, the bypass pipe 105, the valve 106, the first connection portion 107, and the second connection portion 108.

The server rack 101 accommodates the electronic apparatus 300 having a heat-producing component. A plurality of the heat receiving portions 102 accumulate refrigerant. Further, a plurality of the heat receiving portions 102 are arranged on the back face of the server rack 101 along the vertical direction G. Further, a plurality of the heat receiving portions 102 receive the heat of the electronic apparatus 300 via refrigerant. The heat dissipation portion 200 dissipates the heat of the electronic apparatus 300 that is received by each of a plurality of the heat receiving portions 102. The vapor pipe 103 connects the heat dissipation portion 200 and each of a plurality of the heat receiving portions 102. The vapor pipe 103 is provided for flowing the refrigerant vaporized by the heat in the heat receiving portion 102 to the heat dissipation portion 200 from each of a plurality of the heat receiving portions 102. The liquid pipe 104 connects the heat dissipation portion 200 and each of a plurality of the heat receiving portions 102. The liquid pipe 104 is provided for flowing the refrigerant liquefied in the heat dissipation portion 200 to each of a plurality of the heat receiving portions 102 from the heat dissipation portion 200. The bypass pipe 105 connects the vapor pipe 103 and the liquid pipe 104. The valve 106 opens and closes the flow path of the bypass pipe 105. The first connection portion 107 connects the vapor pipe 103 and the bypass pipe 105. The second connection portion 108 connects the liquid pipe 104 and the bypass pipe 105. The first connection portion 107 is disposed at a position higher than that of the second connection portion 108 in the vertical direction G.

The electronic apparatus cooling system 1000 has an effect that is the same as that of the electronic apparatus enclosure device 100 mentioned above.

Second Exemplary Embodiment

Figure 8:
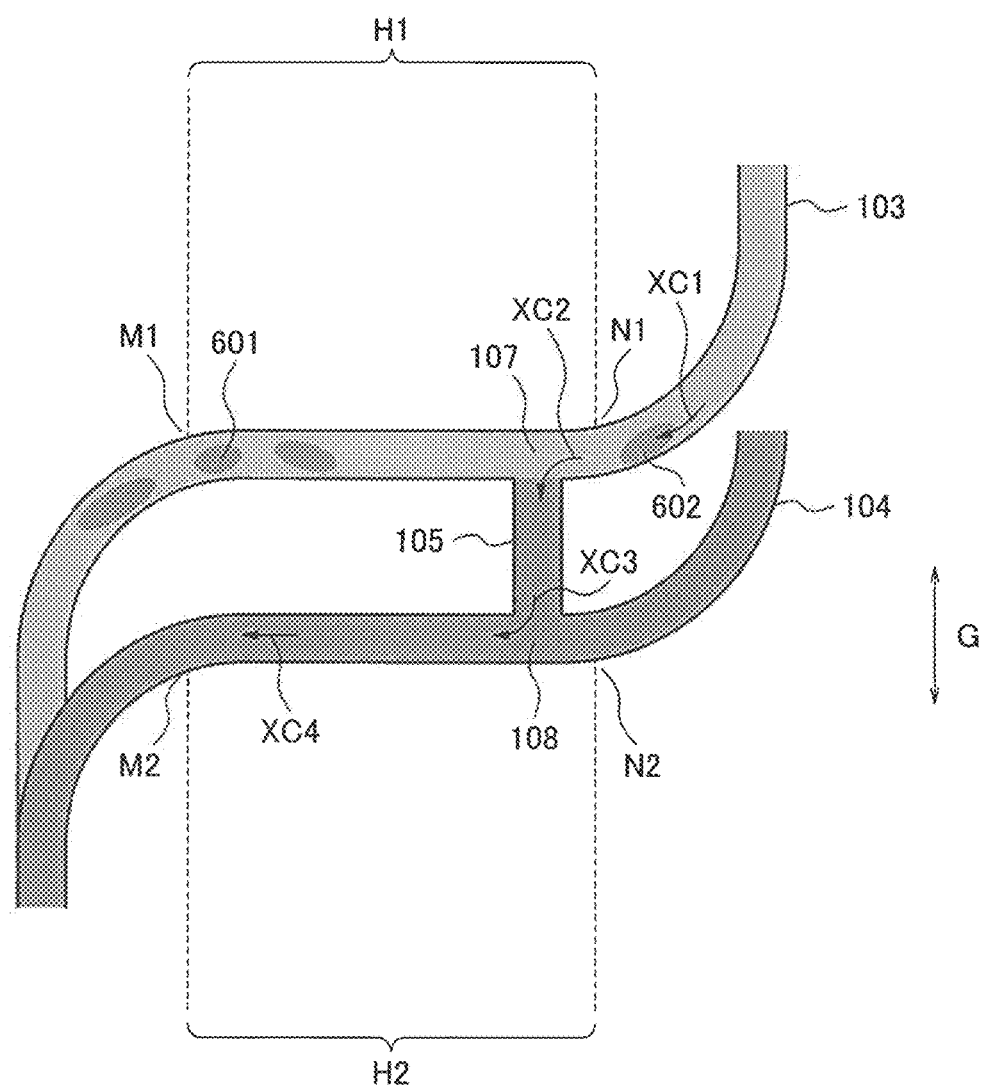
FIG. 8 is an enlarged transparent perspective view schematically showing a structure around a vapor pipe, a liquid pipe, and a bypass pipe of an electronic apparatus cooling system according to a second exemplary embodiment of the present invention.

Next, a structure of an electronic apparatus cooling system according to a second exemplary embodiment of the present invention will be described. FIG. 8 is an enlarged transparent perspective view schematically showing a structure around the vapor pipe 103, the liquid pipe 104, and the bypass pipe 105 of the electronic apparatus cooling system according to the second exemplary embodiment of the present invention. Further, for convenience of explanation, the vertical direction G is shown in FIG. 8.

The electronic apparatus cooling system according to the second exemplary embodiment of the present invention has the same structure as the electronic apparatus cooling system 1000 according to the first exemplary embodiment of the present invention.

As shown in FIG. 8, in the electronic apparatus cooling system according to the second exemplary embodiment of the present invention, the vapor pipe 103 and the liquid pipe 104 have a horizontal section H1 and a horizontal section H2 that are arranged in a direction approximately perpendicular to the vertical direction G, respectively.

Further, the vapor pipe 103 and the liquid pipe 104 are disposed so as to extend between end parts M1 and M2 of the horizontal sections H1 and H2 that are located at the heat receiving portion 102 side and a top edge part of the server rack 101 in the approximately vertical direction G. Similarly, the vapor pipe 103 and the liquid pipe 104 are disposed so as to extend between end parts N1 and N2 of the horizontal sections H1 and H2 that are located at the heat dissipation portion 200 side and the heat dissipation portion 200 in the approximately vertical direction G. Namely, the vapor pipe 103 and the liquid pipe 104 are bent twice between the server rack 101 and the ceiling 500 (refer to FIG. 2) so as to have two vertical sections and one horizontal section, respectively. The bypass pipe 105 is provided in the horizontal sections H1 and H2 and connects the vapor pipe 103 and the liquid pipe 104.

Further, it is preferred that the bypass pipe 105 connects the vapor pipe 103 and the liquid pipe 104 at least at the side of the end parts N1 and N2 of the horizontal sections H1 and H2 that are located at the heat dissipation portion 200 side as shown in FIG. 8. Namely, the bypass pipe 105 is disposed in the vicinity of the above-mentioned bent portions of the vapor pipe 103 and the liquid pipe 104.

As described above, in the electronic apparatus enclosure device according to the second exemplary embodiment of the present invention, the vapor pipe 103 and the liquid pipe 104 have the horizontal section H1 and the horizontal section H2 that are arranged in a direction approximately perpendicular to the vertical direction G, respectively. Further, the vapor pipe 103 and the liquid pipe 104 are disposed so as to extend between the end parts M1 and M2 of the horizontal sections H1 and H2 that are located at the heat receiving portion 102 side and the top edge part of the server rack 101 in the approximately horizontal direction perpendicular to the vertical direction G. Similarly, the vapor pipe 103 and the liquid pipe 104 are disposed so as to extend between the end parts N1 and N2 of the horizontal sections H1 and H2 that are located at the heat dissipation portion 200 side and the heat dissipation portion 200 in the approximately horizontal direction perpendicular to the vertical direction G. The bypass pipe 105 connects the vapor pipe 103 and the liquid pipe 104 in the horizontal sections H1 and H2.

As a result, the refrigerant accumulated in the lower part of the server rack 101 (especially, the heat receiving portion 102 located in the lowermost part of the server rack 101 in the vertical direction G) can efficiently flow back to the liquid pipe 104 from the vapor pipe 103 through the bypass pipe 105 as shown by arrows XC1 to XC4 in FIG. 8. Therefore, the refrigerant can be more efficiently transported to the inside of the apparatus in a short time.

Further, in the electronic apparatus enclosure device according to the second exemplary embodiment of the present invention, the bypass pipe 105 connects the vapor pipe 103 and the liquid pipe 104 at least at the side of the end parts N1 and N2 of the horizontal sections H1 and H2 that are located at the heat dissipation portion 200 side.

As a result, a liquid return 602 generated in the vertical direction G can easily flow back to the bypass pipe 105 by the gravity. Therefore, the time taken before the electronic apparatus cooling system operates at a maximum rate at which the maximum amount of heat can be transported can be further reduced.

Third Exemplary Embodiment

Figure 9:
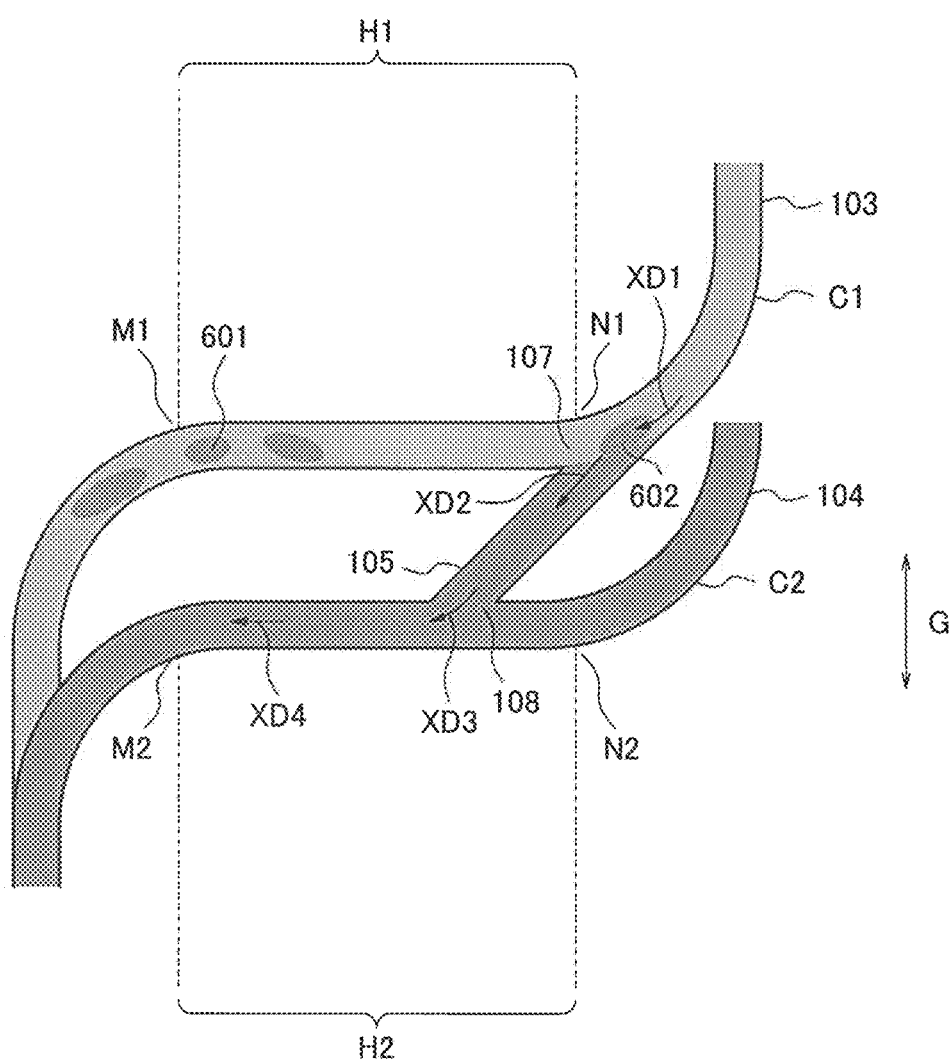
FIG. 9 is an enlarged transparent perspective view schematically showing a structure around a vapor pipe, a liquid pipe, and a bypass pipe of an electronic apparatus cooling system according to a third exemplary embodiment of the present invention.

Next, a structure of an electronic apparatus cooling system according to a third exemplary embodiment of the present invention will be described. FIG. 9 is an enlarged transparent perspective view schematically showing a structure around the vapor pipe 103, the liquid pipe 104, and the bypass pipe 105 of the electronic apparatus cooling system according to the third exemplary embodiment of the present invention. Further, for convenience of explanation, the vertical direction G is shown in FIG. 9.

Here, there is a difference between the position of the bypass pipe 105 shown in FIG. 8 and the position of the bypass pipe 105 shown in FIG. 9.

As shown in FIG. 9, in the electronic apparatus cooling system according to the third exemplary embodiment of the present invention, the vapor pipe 103 and the liquid pipe 104 include bent pipe portions C1 and C2 at least at the side of the end parts N1 and N2 of the horizontal sections H1 and H2 of the vapor pipe 103 and the liquid pipe 104 that are located at the heat dissipation portion 200 side, respectively. The bypass pipe 105 is connected to the vapor pipe 103 and the liquid pipe 104 at least so as to contact with the curved surfaces of the bent pipe portion C1 of the vapor pipe 103 and the bent pipe portion C2 of the liquid pipe 104.

As a result, as shown by arrows XD1 to XD4 in FIG. 9, a flow pressure loss which occurs when the liquid return 602 generated in the vertical direction G flows back to the bypass pipe 105 by the gravity can be reduced. Therefore, the time taken before the electronic apparatus cooling system operates at a maximum rate at which the maximum amount of heat can be transported can be further reduced.

Fourth Exemplary Embodiment

Figure 10:
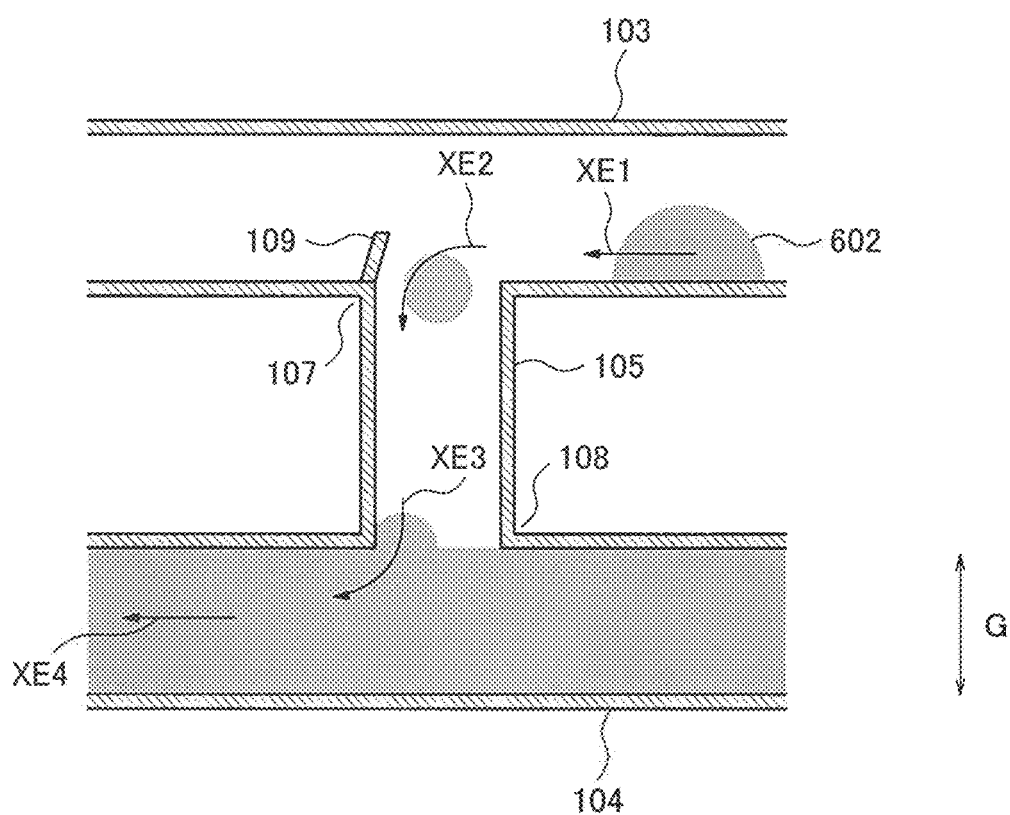
FIG. 10 is an enlarged sectional view schematically showing a structure around a vapor pipe, a liquid pipe, and a bypass pipe of an electronic apparatus cooling system according to a fourth exemplary embodiment of the present invention.

Next, a structure of an electronic apparatus cooling system according to a fourth exemplary embodiment of the present invention will be described. FIG. 10 is an enlarged sectional view schematically showing the structure around the vapor pipe 103, the liquid pipe 104, and the bypass pipe 105 of the electronic apparatus cooling system according to the fourth exemplary embodiment of the present invention. Further, for convenience of explanation, the vertical direction G is shown in FIG. 10.

Here, the structure shown in FIG. 7 has not a guide portion but the structure shown in FIG. 10 has a guide portion 109. This is a difference between the structure shown in FIG. 7 and the structure shown in FIG. 10.

As shown in FIG. 10, in the electronic apparatus cooling system according to the fourth exemplary embodiment of the present invention, the guide portion 109 is disposed so as to protrude from the first connection portion 107 in the vapor pipe 103. Further, the guide portion 109 prevents refrigerant in the vapor pipe 103 from flowing toward a plurality of the heat receiving portions 102.

As a result, the liquid return 602 can easily flow back to the bypass pipe 105 along the guide portion 109 as shown by arrows XE1 to XE4 in FIG. 10. Therefore, the time taken before the electronic apparatus cooling system operates at a maximum rate at which the maximum amount of heat can be transported can be further reduced.

Fifth Exemplary Embodiment

Figure 11:
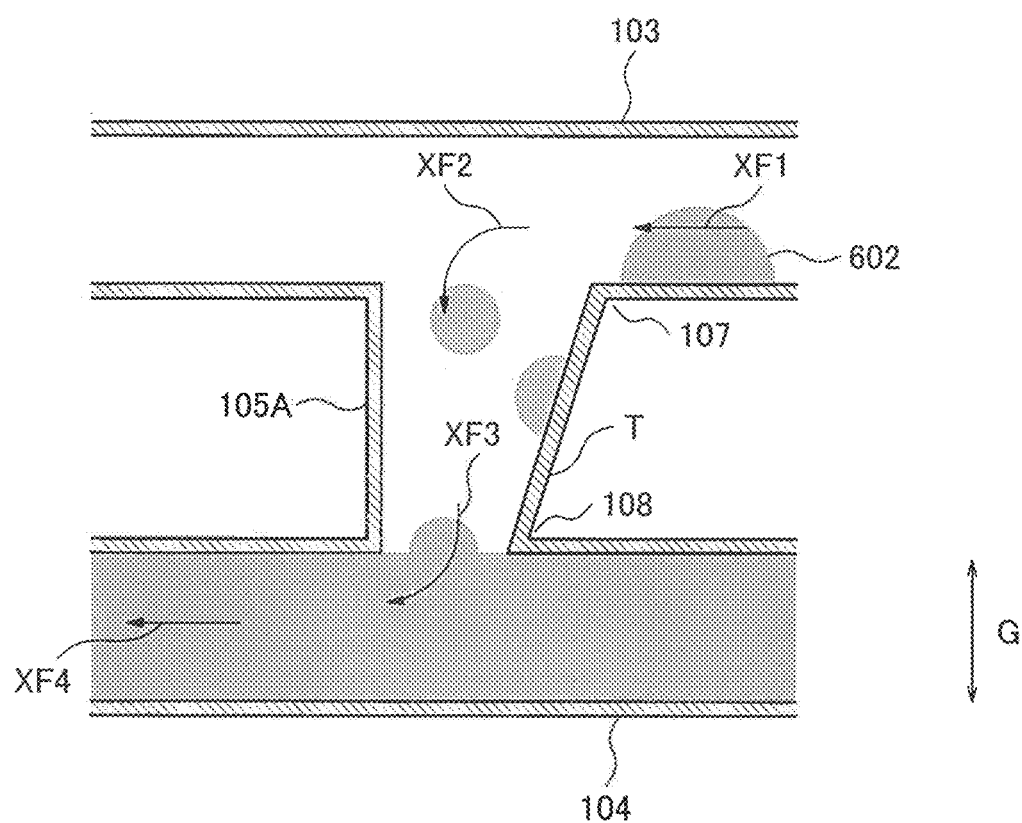
FIG. 11 is an enlarged sectional view schematically showing a structure around a vapor pipe, a liquid pipe, and a bypass pipe of an electronic apparatus cooling system according to a fifth exemplary embodiment of the present invention.

Next, a structure of an electronic apparatus cooling system according to a fifth exemplary embodiment of the present invention will be described. FIG. 11 is an enlarged sectional view schematically showing the structure around the vapor pipe 103, the liquid pipe 104, and a bypass pipe 105A of the electronic apparatus cooling system according to the fifth exemplary embodiment of the present invention. Further, for convenience of explanation, the vertical direction G is shown in FIG. 11.

Here, the shape of the bypass pipe 105 shown in FIG. 7 is different from the shape of the bypass pipe 105A shown in FIG. 11.

As shown in FIG. 11, in the electronic apparatus cooling system according to the fifth exemplary embodiment of the present invention, the bypass pipe 105A has a tapered shape in which the cross-sectional area is gradually reduced away from the first connection portion 107 toward the second connection portion 108. Namely, the bypass pipe 105A is formed so that the cross-sectional area of the bypass pipe 105A at the portion (the first connection portion 107) at which the bypass pipe 105A is connected to the vapor pipe 103 is greater than the cross-sectional area of the bypass pipe 105A at the portion (the second connection portion 108) at which the bypass pipe 105A is connected to the liquid pipe 104. Namely, the bypass pipe 105A is formed so as to have a taper T.

As a result, the liquid return 602 can easily flow back to the bypass pipe 105A along the taper T as shown by arrows XF1 to XF4 in FIG. 11. Therefore, the time taken before the electronic apparatus cooling system operates at a maximum rate at which the maximum amount of heat can be transported can be further reduced.

Sixth Exemplary Embodiment

Figure 12:
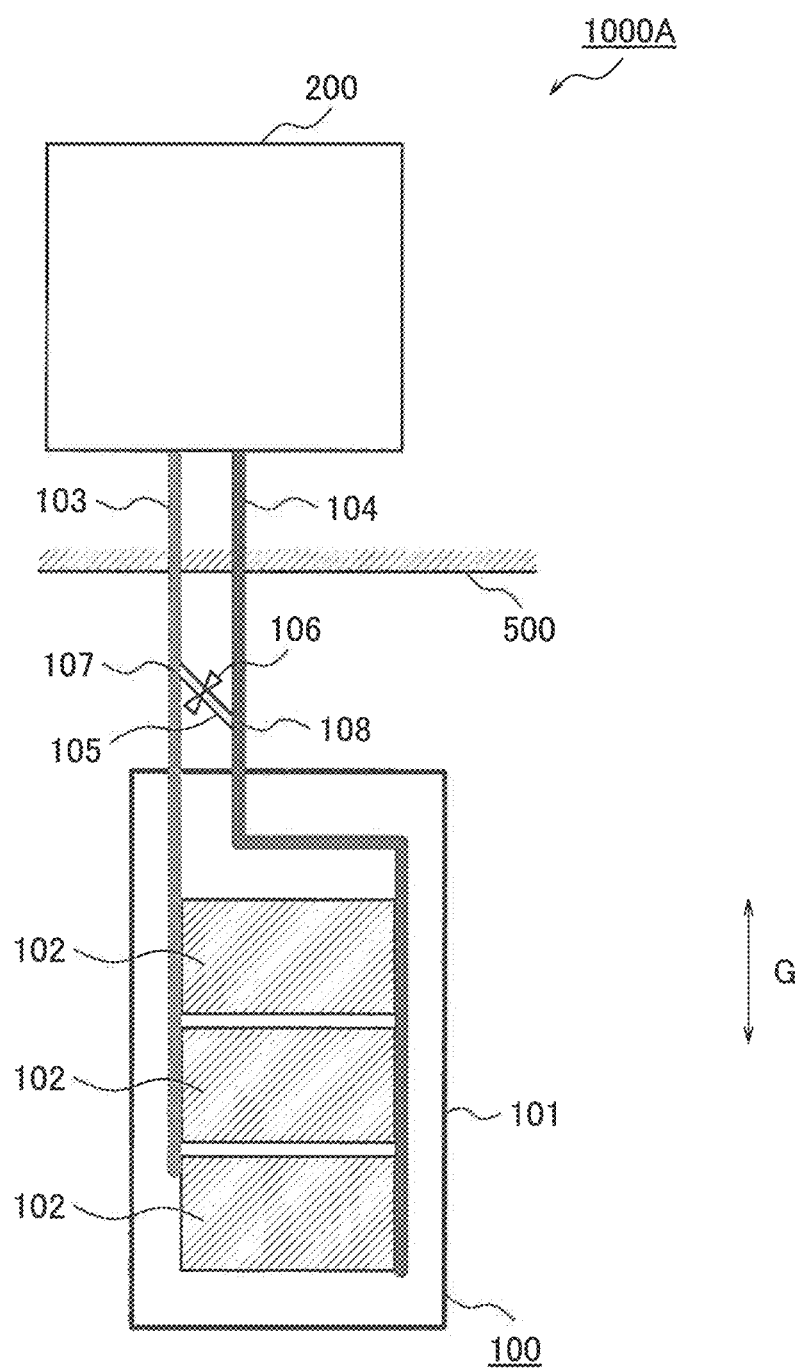
FIG. 12 is a figure showing a structure of an electronic apparatus cooling system according to a sixth exemplary embodiment of the present invention.

Next, a structure of an electronic apparatus cooling system 1000A according to a sixth exemplary embodiment of the present invention will be described. FIG. 12 is a figure showing the structure of the electronic apparatus cooling system according to the sixth exemplary embodiment of the present invention. Further, for convenience of explanation, the vertical direction G is shown in FIG. 12.

As shown in FIG. 12, in the electronic apparatus cooling system 1000A according to the sixth exemplary embodiment of the present invention, the vapor pipe 103 and the liquid pipe 104 are disposed at least so as to extend in an approximately vertical direction G in a space above the top edge part of the server rack 101. Further, the first connection portion 107 is disposed at a position higher than that of the second connection portion 108 in the vertical direction G. Namely, the vapor pipe 103 and the liquid pipe 104 are disposed so as to extend in a direction approximately parallel to the vertical direction G. Further, the first connection portion 107 to which the vapor pipe 103 and the bypass pipe 105 are connected is disposed at a position higher than that of the second connection portion 108 to which the liquid pipe 104 and the bypass pipe 105 are connected in the vertical direction G. As a result, workability of opening/closing the valve 106 can be improved.

Seventh Exemplary Embodiment

Figure 13:
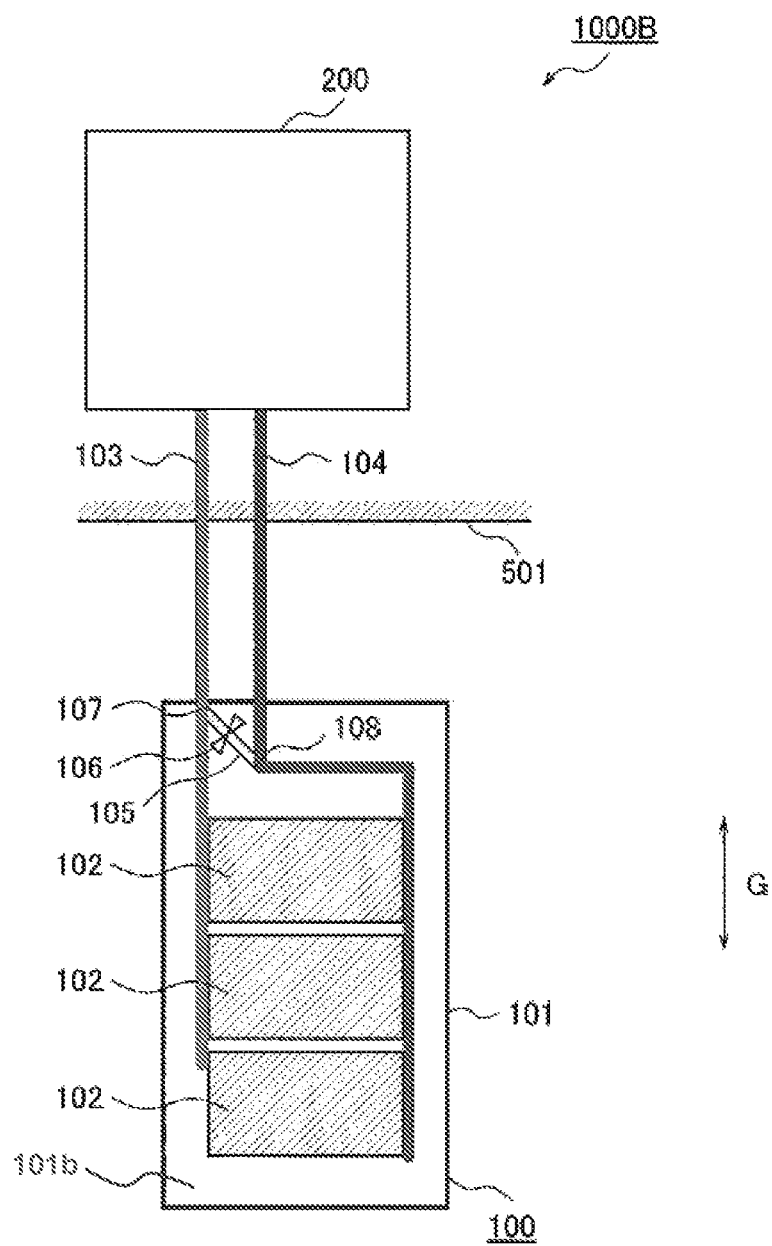
FIG. 13 is a figure showing a structure of an electronic apparatus cooling system according to a seventh exemplary embodiment of the present invention.

Next, a structure of an electronic apparatus cooling system 1000B according to a seventh exemplary embodiment of the present invention will be described. FIG. 13 is a figure showing the structure of the electronic apparatus cooling system according to the seventh exemplary embodiment of the present invention. Further, for convenience of explanation, the vertical direction G is shown in FIG. 13.

Here, the structure shown in FIG. 12 is compared with the structure shown in FIG. 13. In FIG. 12, the bypass pipe 105 and the valve 106 are disposed outside the server rack 101. In contrast, in FIG. 13, the bypass pipe 105 and the valve 106 are disposed in the server rack 101. Further, the bypass pipe 105 and the valve 106 are disposed on the server rack back face 101b (one of the main faces). This is a difference between the structure shown in FIG. 12 and the structure shown in FIG. 13.

As shown in FIG. 13, in the electronic apparatus cooling system 1000B according to the seventh exemplary embodiment of the present invention, the first connection portion 107 and the second connection portion 108 are accommodated in the server rack 101. Further, the bypass pipe 105 and the valve 106 are disposed on the server rack back face 101b (one of the main faces). Namely, the vapor pipe 103 and the liquid pipe 104 are connected to the bypass pipe 105 on the server rack back face 101b of the server rack 101. Therefore, the valve 106 can be easily disposed and the opening/closing work of the valve 106 can be more easily performed.

INDUSTRIAL APPLICABILITY

The present invention can be applied to for example, an application in which exhausted heat is received by all the server rack faces and an electric power consumed by air conditioning of the data center is reduced.

The present invention has been explained above on the basis of the exemplary embodiment. The exemplary embodiment is shown as an example. Various changes, addition/reduction, or combination of the above-mentioned exemplary embodiment can be made without departing from the scope of the invention of the present application. It is understood by the person skilled in the art that modification example obtained by various changes, addition/reduction, or combination is also within the scope of the present invention.

The present invention has been explained above on the basis of the exemplary embodiment shown as an exemplary example. However, the present invention is not limited to the exemplary embodiment described above. Namely, the present invention includes various embodiments that can be understood by the person skilled in the art without departing from the scope of the invention.

This application claims priority from Japanese Patent Application No. 2013-239975, filed on Nov. 20, 2013, the disclosure of which is hereby incorporated by reference in its entirety.

REFERENCE SIGNS LIST 100 electronic apparatus enclosure device
101 server rack
101a server rack front face
101b server rack back face
101c server rack top face
101d server rack bottom face
101e server rack side face
102 heat receiving portion
103 vapor pipe
104 liquid pipe
105 and 105A bypass pipe
106 valve
107 first connection portion
108 second connection portion
109 guide portion
200 heat dissipation portion
300 electronic apparatus
600 liquid-phase refrigerant
600a liquid surface
601 accumulated liquid
602 liquid return

The invention claimed is:
1. An electronic apparatus enclosure device including
a rack accommodating an electronic apparatus having a heat-producing component,
a plurality of evaporators arranged on a back face of the rack along a vertical direction and receiving heat of the electronic apparatus,
a vapor pipe to which a condenser and the evaporators are connected, the condenser dissipating the heat of the electronic apparatus, a liquid pipe to which the condenser and the evaporators are connected, a bypass pipe connecting the vapor pipe and the liquid pipe, a valve disposed in a flow path of the bypass pipe, a first connection connecting the vapor pipe and the bypass pipe, a second connection connecting the liquid pipe and the bypass pipe, and a guide that protrudes from the first connection into the vapor pipe and prevents refrigerant in the vapor pipe from flowing toward the evaporators, wherein the first connection is disposed at a position higher than that of the second connection, and wherein a refrigerant naturally circulates through the vapor pipe, the liquid pipe, the condenser, and the evaporators.

2. The electronic apparatus enclosure device described in claim 1 wherein the vapor pipe includes a first vertical portion, a second vertical portion, and first horizontal sections, the first horizontal sections being arranged in a direction perpendicular to a vertical direction, the first horizontal sections having first ends disposed adjacent one side of the rack and second ends disposed adjacent an opposite side of the rack, a first horizontal section of the first horizontal sections being disposed out of the rack, the liquid pipe includes a third vertical portion, a fourth vertical portion, and second horizontal sections, the second horizontal sections being arranged in the direction perpendicular to the vertical direction, the second horizontal sections having third ends disposed adjacent to the one side of the rack and fourth ends disposed adjacent to the opposite side of the rack, a second horizontal section of the second horizontal sections being disposed out of the rack, the first vertical portion of the vapor pipe extends in the vertical direction between the first ends of the first horizontal sections of the vapor pipe, the second vertical portion of the vapor pipe extends in the vertical direction between a second end of the first horizontal section disposed out of the rack and the condenser, the third vertical portion of the liquid pipe extends in the vertical direction between the third ends of the second horizontal sections of the liquid pipe, the fourth vertical portion of the liquid pipe extends in the vertical direction between a fourth end of the second horizontal section disposed out of the rack and the condenser, and the first connection is provided in the first horizontal section disposed out of the rack, and the second connection is provided in the second horizontal section disposed out of the rack.

3. The electronic apparatus enclosure device described in claim 2 wherein the bypass pipe connects the second end of the first horizontal section of the vapor pipe disposed out of the rack and the fourth end of the second horizontal section of the liquid pipe disposed out of the rack.

4. The electronic apparatus enclosure device described in claim 3 wherein the vapor pipe and the liquid pipe include bent pipe portions adjacent the second end of the of the first horizontal section of the vapor pipe disposed out of the rack and the fourth end of the second horizontal section of the liquid pipe disposed out of the rack, and the bypass pipe is connected to the vapor pipe and the liquid pipe at least so as to contact with curved surfaces of the bent pipe portions of the vapor pipe and the liquid pipe.

5. The electronic apparatus enclosure device described in claim 1 wherein the vapor pipe and the liquid pipe are disposed at least so as to extend in an approximately vertical direction in a space above a top edge part of the rack and the first connection is disposed at a position higher than that of the second connection in the vertical direction.

6. The electronic apparatus enclosure device described in claim 1 wherein the first connection and the second connection are accommodated in the rack and the bypass pipe and the valve are disposed on one main face of the rack.

7. An electronic apparatus cooling system including the electronic apparatus enclosure device described in claim 1 and the condenser.

* * * * *